United States Patent [19]

Shimogawa

[11] Patent Number: 5,202,823
[45] Date of Patent: Apr. 13, 1993

[54] SEMICONDUCTOR MEMORY DEVICE HAVING SIGNAL RECEIVING FACILITY FABRICATED FROM BI-CMOS CIRCUITS

[75] Inventor: Kenjyu Shimogawa, Tokyo, Japan
[73] Assignee: NEC Corporation, Tokyo, Japan
[21] Appl. No.: 673,998
[22] Filed: Mar. 25, 1991
[30] Foreign Application Priority Data

Mar. 29, 1990 [JP] Japan ..................................... 2,82683

[51] Int. Cl.$^5$ .............................................. G11C 13/00
[52] U.S. Cl. .......................... 365/230.06; 365/230.01; 365/230.08
[58] Field of Search .............. 365/182, 189.01, 230.01, 365/230.03, 230.06, 189.05, 230.08, 226, 227; 307/530

[56] References Cited

U.S. PATENT DOCUMENTS 5,119,334 6/1992 Fujii ................................ 365/230.06

Primary Examiner—Terrell W. Fears
Attorney, Agent, or Firm—Sughrue, Mion, Zinn, Macpeak & Seas

[57] ABSTRACT

A semiconductor memory device is fabricated from Bi-CMOS circuits and comprises a plurality of memory cells arranged in rows and columns, a plurality of word lines respectively coupled to the rows of the plurality of memory cells, a row address buffer unit coupled between first and second power voltage sources and supplied with row address bits for producing internal row address signals, a row address decoder unit responsive to the internal address signals and producing decode signals, a control signal buffer unit coupled between the first and second power voltage sources and supplied with an external control signal for producing a decode enable signal, and a word line driving unit responsive to the decode signals and selectively driving the word lines in the presence of the decode enable signal, wherein a monitoring unit is operative to monitor the power voltage level of one of the first and second power voltage sources and enables the control signal buffer unit to produce the decode enable signal when the power voltage level allows the internal address signals to become effective to the row address decoder unit so that any multiple selection of word lines never takes place.

11 Claims, 7 Drawing Sheets

SEMICONDUCTOR MEMORY DEVICE HAVING SIGNAL RECEIVING FACILITY FABRICATED FROM BI-CMOS CIRCUITS

FIELD OF THE INVENTION

This invention relates to a semiconductor memory device and, more particularly, to a signal receiving facility implemented by a Bi-CMOS circuit.

DESCRIPTION OF THE RELATED ART

A typical example of the semiconductor memory device is illustrated in FIG. 1 and largely comprises a memory cell array 1, a control signal buffer unit 2, a row address buffer unit 3, a row address decoder unit 4 and a word line driving unit 5. The other component units such as a column address decoder unit are not shown in FIG. 1, because they are less important to describe problems inherent in the prior art semiconductor memory device. The memory cell array 1 has a plurality of memory cells only two of which are shown and labeled with M11 and Mm1, and the memory cells M11 and Mm1 are coupled to a bit line pair BLP. Load transistors Qp1 and Qp2 are coupled between the bit line pair BLP and a ground line 6, and the load transistors Qp1 and Qp2 are formed by p-channel type field effect transistors with respective gate electrodes coupled to a negative power voltage source. A small triangle stands for the negative power voltage source, and the negative power voltage source produces a negative voltage level Vee. Each of the memory cells M11 to Mm1 is implemented by a flip-flop circuit, and each memory cell M11 or Mm1 comprises two series combinations of resistors R1 and R2 and discharging transistors Qn3 and Qn4. The discharging transistors Qn3 and Qn4 are formed by n-channel type field effect transistors, and the gate electrodes of the discharging transistors Qn3 and Qn4 are coupled to the drain nodes of the discharging transistors Qn4 and Qn3, respectively. Switching transistors Qn5 and Qn6 are coupled between the bit line pair BLP and the drain nodes of the discharging transistors Qn3 and Qn4, and the switching transistors Qn5 and Qn6 are of the n-channel type. Since one of the discharging transistors Qn3 and Qn4 is turned on and the other is turned off, high and low voltage levels take place at the drain nodes of the discharging transistors Qn3 and Qn4, and the high and low voltage levels at the drain nodes depend on a data bit memorized therein. The memory cell array 1 is further associated with word lines WL1 to WLm, and only one of the word lines WL1 to WLm is shifted to an active level.

The control signal buffer unit 2 comprises an input buffer circuit 2a responsive to an external chip select signal CS for producing controlling signals CTL1 and CTL2, an emitter follower circuit 2b for producing secondary controlling signals CTL3 and CTL4, and a level shifting circuit 2c responsive to the secondary controlling signals CTL3 and CTL4 for producing a drive enable signal DE, and the drive enable signal DE is applicable to word line driving unit 5 fabricated from field effect transistors. The external chip enable signal CS is supplied to an amplifier circuit which is formed by a series combination of a bipolar transistor Qb7 and a resistor R3 coupled between a high voltage or Vcc line 2d and the negative power voltage source, and the emitter node of the bipolar transistor Qb7 is coupled to a difference amplifier circuit. The difference amplifier circuit comprises two series combinations of resistors R4 and R5 and bipolar transistors Qb8 and Qb9 coupled in parallel between the high voltage line 2d and a common emitter node N1, and a series combination of a bipolar transistor Qb10 and a resistor R6 coupled between the common emitter node N1 and the negative power voltage source. With a signal Vb1, the series combination of the bipolar transistor Qb10 and the resistor R6 serves as a constant current source, and a reference voltage level Vr1 is supplied to the base node of the bipolar transistor Qb9. Since the emitter node of the bipolar transistor Qb7 is coupled to the base node of the bipolar transistor Qb8, the bipolar transistors Qb8 and Qb9 complementarily vary the voltage levels at the collector nodes N11 and N12. Though not shown in the drawings, the reference voltage Vr1 is produced by a series combination of resistors and three diodes coupled between two power voltage sources respectively producing the Vcc level and the negative voltage level Vee, and the absolute value of the reference voltage level Vr1 is three times as large as the forward voltage of the diode with respect to the negative voltage level Vee.

The controlling signals CTL1 and CTL2 complementarily change the voltage levels depending upon the voltage level at the emitter node of the bipolar transistor Qb7. The emitter follower circuit 2b has two series combinations of bipolar transistors Qb11 and Qb12, diode elements D1 and D2, and resistors R7 and R8 coupled in parallel between the high voltage line 2d and the negative power voltage source. The emitter follower circuit 2b is responsive to the controlling signals CTL1 and CTL2, and the secondary controlling signals CTL3 and CTL4 are changed in voltage level between the negative voltage level Vee and a predetermined voltage level Vh.

The level shifting circuit 2c comprises two series combinations of p-channel type field effect transistors Qp13 and Qp14 and n-channel type field effect transistors Qn15 and Qn16, and an inverter circuit INV1. The secondary controlling signals CTL3 and CTL4 are supplied to the p-channel type field effect transistors Qp13 and Qp14 and change the channel conductances thereof. Since the gate electrodes of the n-channel type field effect transistors Qn15 and Qn16 are coupled to the drain node of the field effect transistor Qn15, the n-channel type field effect transistors Qn15 and Qn16 serve as load transistors. The variation of the secondary controlling signals CTL3 and CTL4 is relayed through the p-channel type field effect transistors Qp13 and Qp14 to the voltage level at the common drain node N2, and the inverter circuit INV1 produces the drive enable signal DE in the MOS level.

The row address buffer unit 3 is constituted by a plurality of address buffer circuits respectively supplied with input address bits, and produces internal address signals. Only one of the address buffer circuits for the address bit A1 is shown in FIG. 1, and the address buffer circuit produces the internal address signal Sa1. The address buffer circuit comprises an input buffer circuit 3a, an emitter follower circuit 3b and a level shifting circuit 3c, and those circuits 3a to 3c are similar in arrangement to the input buffer circuit 2a, the emitter follower circuit 2b and the level shifting circuit 2c, respectively. For this reason, no further description is incorporated hereinbelow. Whenever description refers to the component elements of the circuits 3a to 3c, and the component element is labeled with the same reference with suffix as that used for the corresponding element of the control signal buffer unit 2.

The row address decoder unit 4 is implemented by NAND gate array, and only one of the NAND gates is labeled with NAND1 in FIG. 1. The address buffer circuits are selectively coupled to the NAND gate array, and a NOR gate array of the word line driving unit 5 is selectively coupled to the NAND gates. When the address bits are supplied to the address buffer unit 3, the internal address signals are decoded by the address decoder unit 4, and only one of the NOR gates 5a, 5b, . . . drives the associated word line WL1 or WLm.

A problem is encountered in the prior art semiconductor memory device in that a large amount of transient current TC flows from the high voltage line 6 to the negative power voltage source as shown in FIG. 2 upon activation of the semiconductor memory device. The problem is resulted from multiple selection of the word lines WL1 to WLm causing all of the bit line pairs to couple through the memory cells M11 to Mm1 to the negative power voltage source. Dispersion of the transistor characteristics is causative of the multiple selection of the word lines WL1 to WLm, and the dispersion takes place due to fluctuation of process parameters of a fabrication process of the semiconductor memory device.

In order to allow the input buffer circuits 2a and 3a to normally behave, the negative power voltage source should exceed a certain voltage Vmin level given as $$Vmin = Vr1 + Vbe9 + Vce10 \qquad \text{Equation 1}$$

where Vbe9 is the voltage across the forward-biased emitter-base junction of the bipolar transistor Qb9 or the bipolar transistor Qb9' and Vce10 is the voltage between the collector and the emitter of the bipolar transistor Qb10 or Qb10'. However, while the negative power voltage source does not reach the certain voltage level Vmin, the bipolar transistors Qb8 to Qb10 and Qb8' to Qb10' are turned off, and the collector nodes N11, N12, N13 and N14 are pulled up to the Vcc level. If the negative voltage level Vee does not reach the total voltage level of the forward-biased voltage of the diode D1, D1', D2 or D2' and the forward-biased emitter-base voltage level of the bipolar transistor Qb11, Qb11', Qb12 or Qb12', the bipolar transistors Qb11, Qb12, Qb11' and Qb12' remain off, and the secondary controlling signals CTL3, CTL4, CTL3' and CTL4' are as low as the negative voltage level Vee. The total amount of the forward-biased voltage levels of the diode and the bipolar transistor is estimated at 1.4 volts. When the negative voltage level Vee exceeds −1.4 volts, the bipolar transistors Qb11, Qb12, Qb11' and Qb12' turn on, and the secondary controlling signals CTL3, CTL4, CTL3' and CTL4' are regulated to −1.4 volts. The secondary controlling signals CTL3, CTL4, CTL3' and CTL4' of −1.4 volts allow the p-channel type field effect transistors Qp13, Qp14, Qp13' and Qp14 to turn off, and the nodes N2 and N2' remain in a negative low voltage level. The inverter circuits INV1 and INV1' produce the drive enable signal DE of the high level and the internal address signal Sa1 of the high level. The other address buffer circuits also produces internal address signals of the low level. This results in that the word line driving unit 5 does not select any word line WL1 or WLm.

However, if the dispersion due to fluctuation of the process parameters increases the absolute value of the certain voltage level Vmin to 2.8 volts for the input buffer circuit 2a and to 3.0 volts for the input buffer circuit 3a, the control signal buffer unit 2 enters the normal state earlier than the address buffer unit 3. While the reference voltage level Vr1 is not higher than the negative voltage level Vee by the certain voltage level Vmin of 3.0 volts, all of the internal address signals are in the high level, and the external chip select signal CS of the active low level allows the word line driving unit 5 to drive all of the word lines WL1 to WLm to the high level. This results in the multiple selection of the word lines WL1 to WLm. Assuming now that each memory cell M11 or Mm1 consumes 2 to 3 micro-ampere, the memory cell array 1 allows 500 to 700 milliamperes to flow into the negative power voltage source. If the level shifting circuits 2c and 3c are different in threshold level, the multiple selection also takes place, and the large amount of transient current is a serious problem for a system composer using the prior art semiconductor memory device.

SUMMARY OF THE INVENTION

It is therefore an important object of the present invention to provide a semiconductor memory device which is free from the large amount of transient current.

To accomplish the object, the present invention proposes to monitor a power voltage level for enabling a word line driving unit to selectively drive word lines.

In accordance with the present invention, there is provided a semiconductor memory device comprising: a) a plurality of memory cells arranged in rows and columns; b) a plurality of word lines respectively coupled to the rows of the plurality of memory cells; c) a row address buffer unit coupled between first and second power voltage sources and supplied with row address bits for producing internal row address signals; d) a row address decoder unit responsive to the internal address signals and producing decode signals; e) a control signal buffer unit coupled between the first and second power voltage sources and supplied with an external control signal for producing a decode enable signal; f) a word line driving unit responsive to the decode signals and selectively driving the word lines in the presence of the decode enable signal; and g) a monitoring unit operative to monitor the power voltage level of one of the first and second power voltage sources and enabling the control signal buffer unit to produce the decode enable signal when the power voltage level allows the internal address signals to become effective to the row address decoder unit.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 3A:
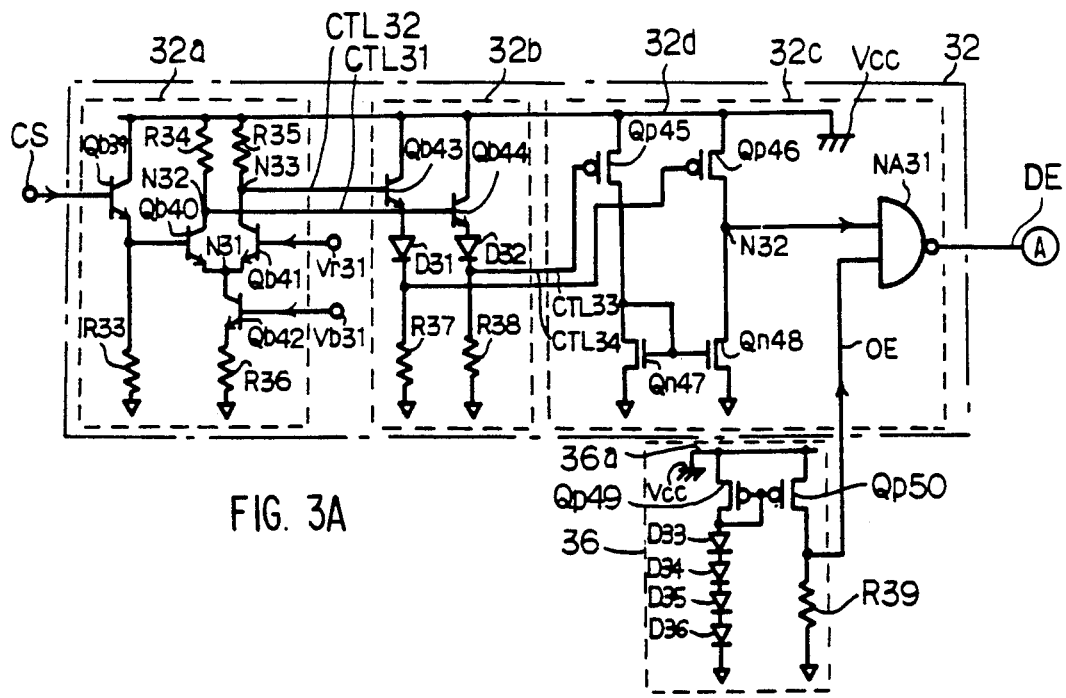
FIG. 3, 3A, 3B and 3C comprise a circuit diagram showing the arrangement of a semiconductor memory device according to the present invention.
Figure 3B:
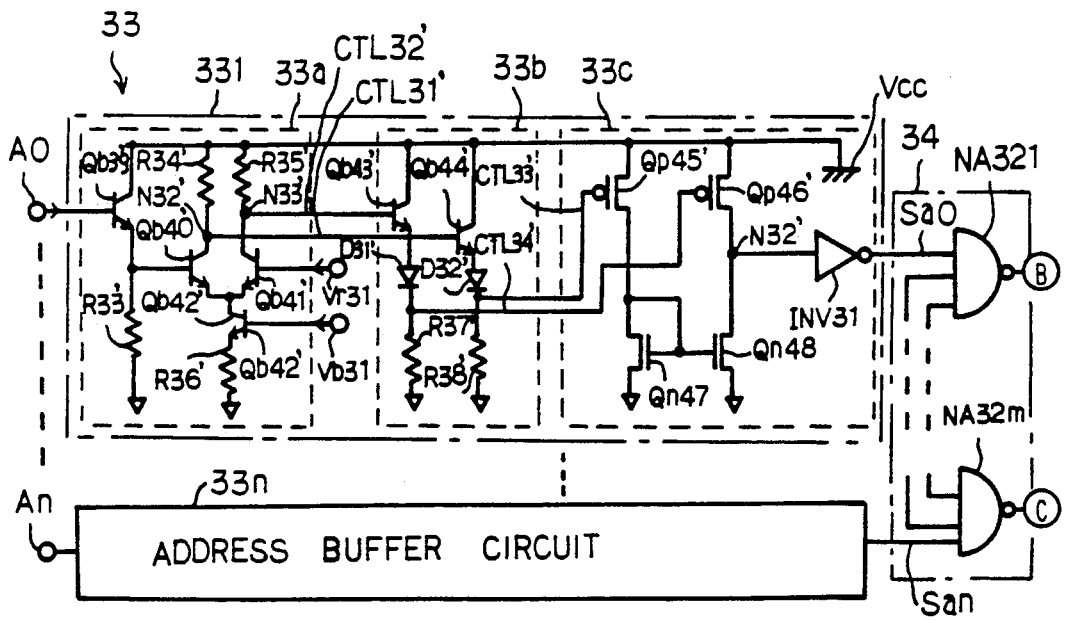
Figure 3:
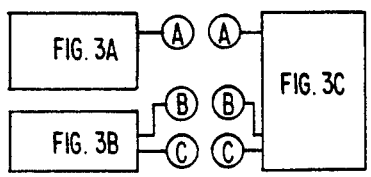
Figure 3C:
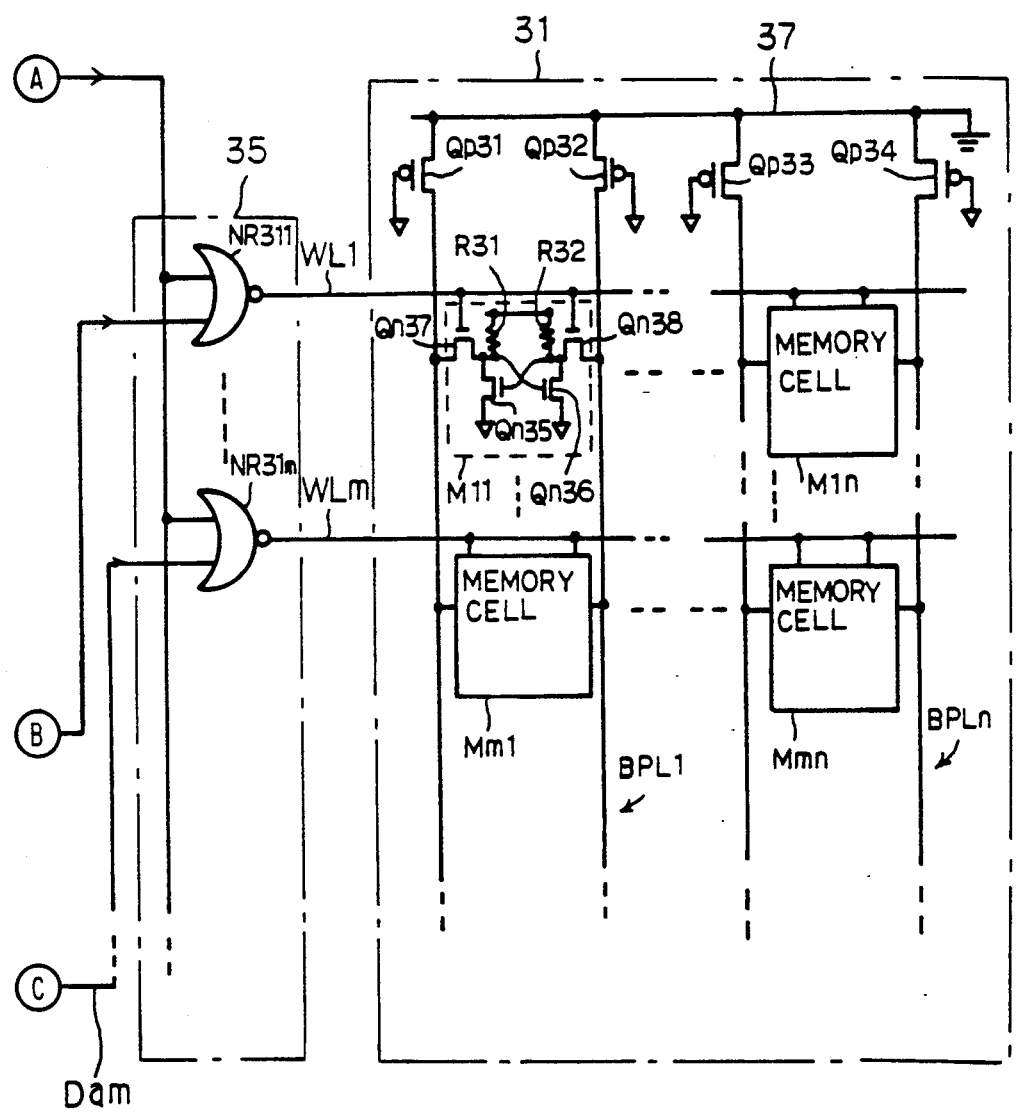

Referring to FIG. 3 of the drawings, a semiconductor memory device embodying the present invention largely comprises a memory cell array 31, a control signal buffer unit 32, a row address buffer unit 33, a row address decoder unit 34, a word line driving unit 35 and a monitoring unit 36. The other component units such as a column address decoder unit and a column selector unit are not shown in FIG. 3 as similar to the prior art semiconductor memory device.

The memory cell array 31 has a plurality of memory cells M11, M1n, Mm1 and Mmn arranged in rows and columns, and the memory cells M11 to Mmn are coupled to bit line pairs BLP1 to BLPn. Load transistors Qp31 to Qp34 are coupled between the bit line pair BLP and a ground line 37, and the load transistors Qp1 and Qp2 are formed by p-channel type field effect transistors with respective gate electrodes coupled to a negative power voltage source. A small triangle also stands for the negative power voltage source, and the negative power voltage source produces a negative voltage level Vee.

Each of the memory cells M11 to Mmn is implemented by a flip-flop circuit, and each memory cell M11 or Mmn comprises two series combinations of resistors R31 and R32 and discharging transistors Qn35 and Qn36. The discharging transistors Qn35 and Qn36 are formed by n-channel type field effect transistors, and the gate electrodes of the discharging transistors Qn35 and Qn36 are coupled to the drain nodes of the discharging transistors Qn36 and Qn35, respectively. Switching transistors Qn37 and Qn38 are coupled between the associated bit line pair BLP1, . . . or BLPn and the drain nodes of the discharging transistors Qn35 and Qn36, and the switching transistors Qn37 and Qn38 are of the n-channel type. Since one of the discharging transistors Qn35 and Qn36 is turned on and the other is turned off, high and low voltage levels take place at the drain nodes of the discharging transistors Qn35 and Qn36, and the high and low voltage levels at the drain nodes depend on a data bit memorized therein. The memory cell array 31 are further associated with word lines WL1 to WLm, and only one of the word lines WL1 to WLm is shifted to an active high level.

Figures 1, 1A:
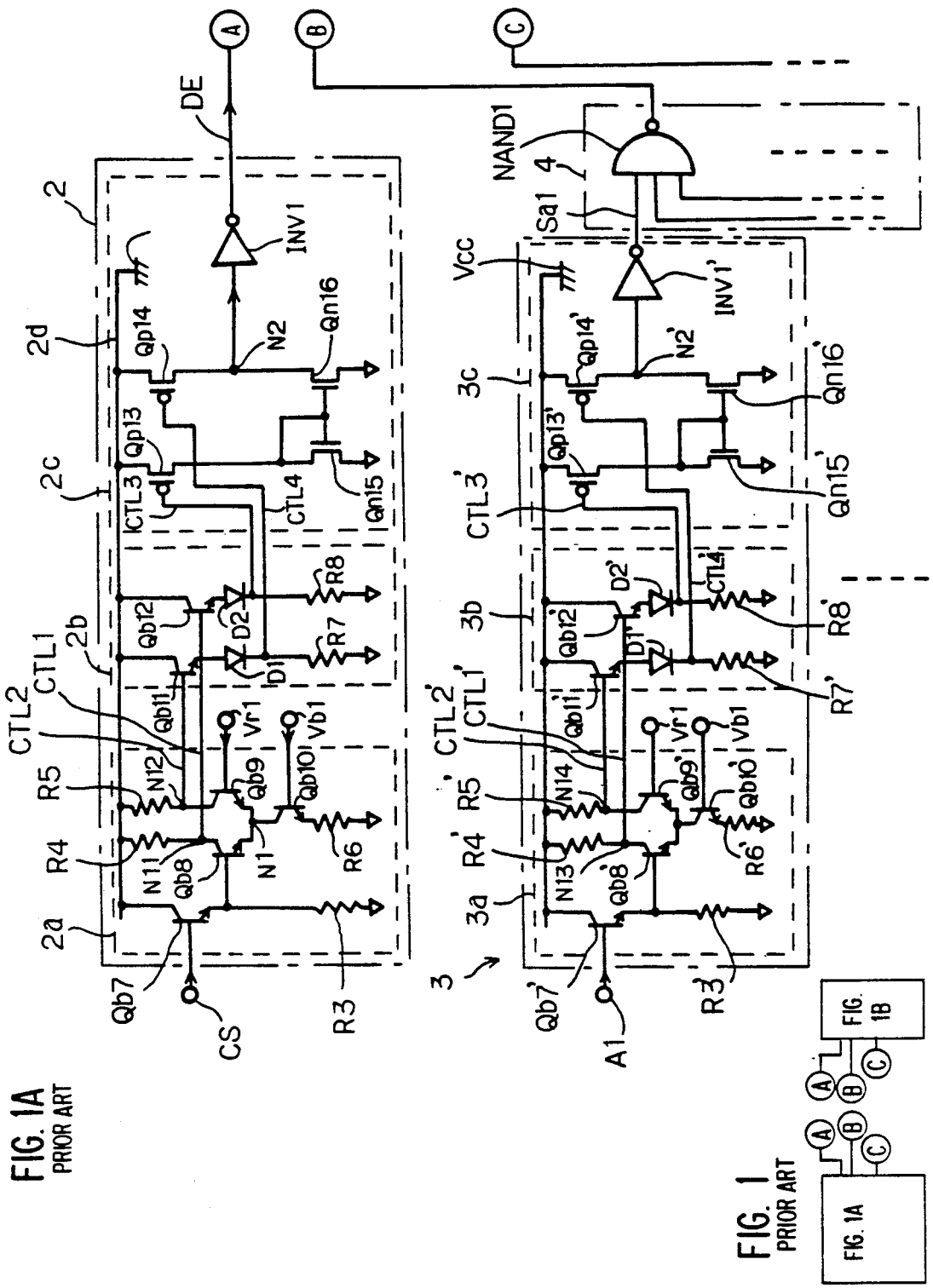
FIG. 1, 1A and 1B comprise a circuit diagram showing the arrangement of a prior art semiconductor memory device.
Figure 1B:
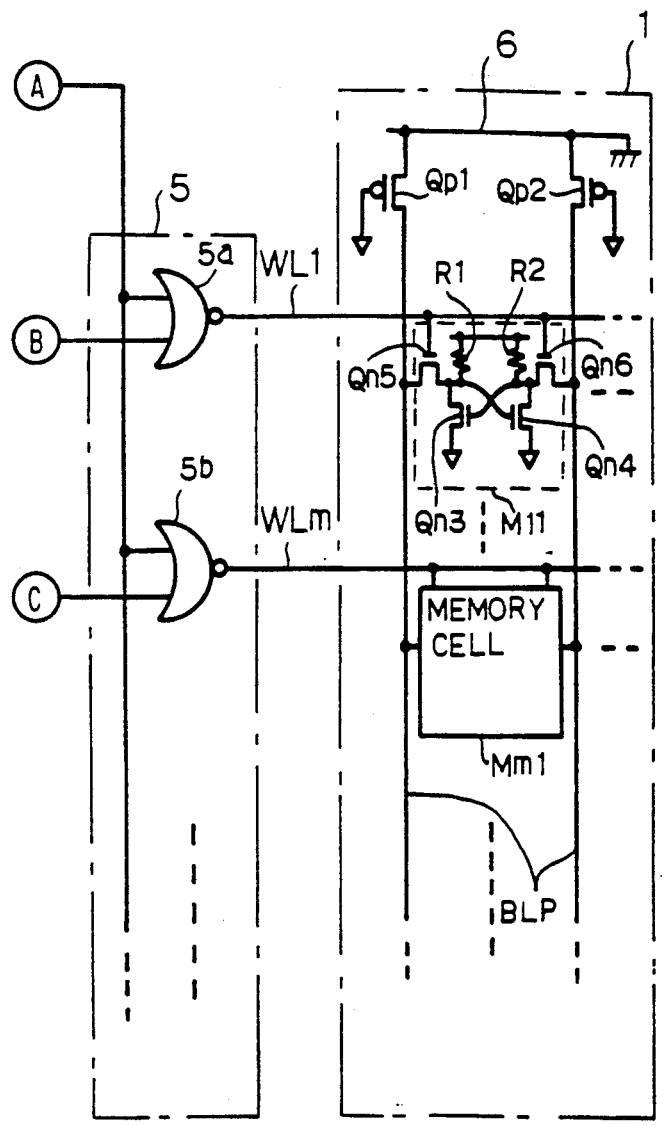

The control signal buffer unit 32 comprises an input buffer circuit 32a responsive to an external chip select signal CS of an active low level for producing controlling signals CTL31 and CTL32, an emitter follower circuit 32b for producing secondary controlling signals CTL33 and CTL34, and a level shifting circuit 32c responsive to the secondary controlling signals CTL33 and CTL34 for producing a drive enable signal DE, and the drive enable signal DE is applicable to the word line driving unit 35 fabricated from field effect transistors. The external chip enable signal CS is supplied to an amplifier circuit which is formed by a series combination of a bipolar transistor Qb39 and a resistor R33 coupled between a high voltage or Vcc line 32d and the negative power voltage source, and the emitter node of the bipolar transistor Qb39 is coupled to a difference amplifier circuit. The difference amplifier circuit comprises two series combinations of resistors R34 and R35 and bipolar transistors Qb40 and Qb41 coupled in parallel between the high voltage line 32d and a common emitter node N31, and a series combination of a bipolar transistor Qb42 and a resistor R36 coupled between the common emitter node N31 and the negative power voltage source. A reference voltage level Vr31 is supplied to the base node of the bipolar transistor Qb41, and the bipolar transistor Qb42 turns on in the presence of a biasing voltage level Vb31. The emitter node of the bipolar transistor Qb39 is coupled to the base node of the bipolar transistor Qb40, and the bipolar transistors Qb40 and Qb41 complementarily vary the voltage levels at the collector nodes N32 and N33. Though not shown in the drawings, the reference voltage Vr31 is produced by a series combination of resistors and three diodes coupled between two power voltage sources respectively producing the Vcc level and the negative voltage level Vee, and the absolute value of the reference voltage level Vr31 is three times as large as the forward voltage of the diode with respect to the negative voltage level Vee as similar to the reference voltage level Vr1 in FIG. 1.

The controlling signals CTL1 and CTL2 complementarily change the voltage levels depending upon the voltage level at the emitter node of the bipolar transistor Qb39. The emitter follower circuit 2b has two series combinations of bipolar transistors Qb43 and Qb44, diode elements D31 and D32, and resistors R37 and R38 coupled in parallel between the high voltage line 32d and the negative power voltage source. The emitter follower circuit 32b is responsive to the controlling signals CTL31 and CTL32, and the secondary controlling signals CTL33 and CTL34 are changed in voltage level between the negative voltage level Vee and a predetermined voltage level Vh.

The level shifting circuit 32c comprises two series combinations of p-channel type field effect transistors Qp45 and Qp46 and n-channel type field effect transistors Qn47 and Qn48, and a NAND gate NA31. The secondary controlling signals CTL33 and CTL34 are supplied to the p-channel type field effect transistors Qp45 and Qp46 and change the channel conductances of the p-channel type field effect transistors Qp45 and Qp46. Since the gate electrodes of the n-channel type field effect transistors Qn47 and Qn48 are coupled to the drain node of the n-channel type field effect transistor Qn47, respectively, the n-channel type field effect transistors Qn47 and Qn48 serve as load transistors. The variation of the secondary controlling signals CTL3 and CTL4 is relayed through the p-channel type field effect transistors Qp45 and Qp46 to the voltage level at the common drain node N32, and the NAND gate NA31 produces the drive enable signal DE in the presence of an output enable signal OE of an active high level. The output enable signal OE enables the NAND gate NA31 upon internal address signals Sa0 to San become valid or effective as described hereinbelow.

Figure 4:
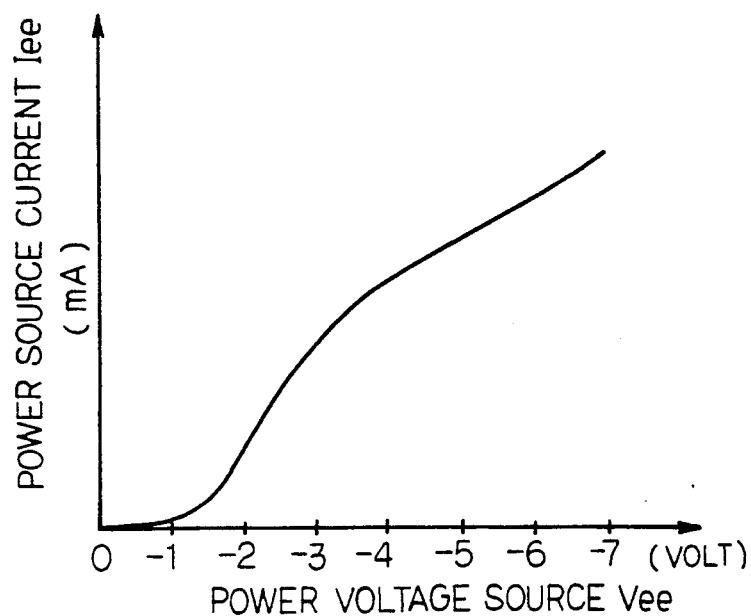
FIG. 4 is a graph showing the transient current in terms of the voltage level at a negative power voltage source incorporated in the semiconductor memory device shown in FIG. 3.
Figure 2:
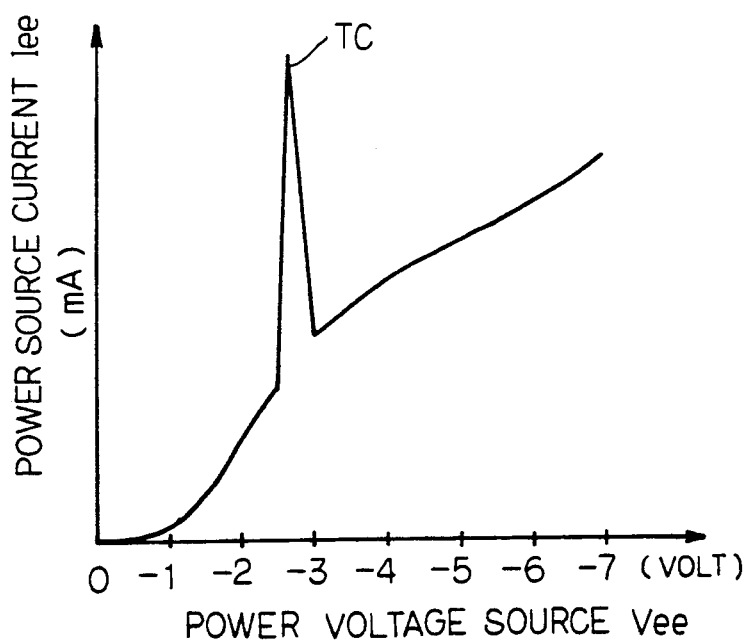
FIG. 2 is a graph showing the transient current in terms of the voltage level at the negative power voltage source of the prior art semiconductor memory device.

The monitoring unit 36 comprises a first series combination of a p-channel type field effect transistor Qp49 and diodes D33 to D36 coupled between the high voltage or Vcc line 36a and the negative power voltage source and a second series combination of a p-channel type field effect transistor Qp50 and a resistor R39 also coupled between the high voltage line 36a to the negative power voltage source. The gate electrodes of the p-channel type field effect transistors Qp49 and Qp50 are coupled to the anode of the diode D33, and the output enable signal OE takes place at the drain node of the p-channel type field effect transistor Qp50. The resistor R39 provides an extremely high resistance against the current passing therethrough. In this instance, the on-resistance of the p-channel type field effect transistor Qp50 is of the order of 1 kiloohms, and the resistor R39 is as large as 50 kilo-ohms. While the negative power voltage source produces a negative voltage level smaller in absolute value than the total amount of the forward voltage Vfd of the diode array D33 to D36 and the threshold voltage Vp49 of the p-channel type field effect transistor Qp49 or Qp50, the p-channel type field effect transistors Qp49 and Qp50 are turned off. The output enable signal OE remains in the inactive low level, and the NAND gate NA31 never produces the decode enable signal DE regardless of the external chip select signal CS. However, after the negative voltage level reaches and becomes larger in the absolute value than the total amount of the forward voltage Vfd and the threshold voltage Vp49, the p-channel type field effect transistors Qp49 and Qp50 turn on and the output enable signal OE is approximately as large as the high voltage level Vcc due to the extremely large resistance of the resistor R39. With the output enable signal OE, the NAND gate NA31 is enabled to produce the decode enable signal DE. Thus, the decode enable signal DE is produced after the negative voltage level becomes low enough to allow the internal address signals Sa0 to San to be valid. For this reason, no multiple selection of the word lines WL1 to WLm takes place even if the external chip select signal CS remains in the active low level. In this instance, the total amount of the forward voltage Vfd and the threshold voltage Vp49 is adjusted to about 3.7 volts, and, accordingly, the decode enable signal DE is kept in the inactive high level regardless of the external chip select signal CS while the absolute value of the negative voltage level is less than 3.7. The row address buffer unit 33 has been already responsive to the address bits A0 to An before reaching −3.7 volts, and the row address decoder unit 34 can select one of the word lines WL1 to WLm depending upon the row address bits A0 to An. The memory cell array 31 is surely prevented from any multiple selection of word lines WL1 to WLm, and the negative voltage level Vee is smoothly varied without any transient current as shown in FIG. 4.

The row address buffer unit 33 is constituted by a plurality of address buffer circuits 331 to 33n respectively supplied with input address bits A0 to An, and produces internal address signals Sa0 to San. Each of the address buffer circuit comprises an input buffer circuit 33a, an emitter follower circuit 33b and a level shifting circuit 33c, and those circuits 33a to 33c are similar in arrangement to the input buffer circuit 32a, the emitter follower circuit 32b and the level shifting circuit 32c, respectively, except for the NAND gate NA31 replaced with an inverter circuit INV31. For this reason, the component elements of the address buffer circuit 331 are labeled with the same references with suffixes, and no further description is incorporated hereinbelow.

The row address decoder unit 34 is implemented by NAND gate array, and only two of the NAND gates are labeled with NA321 to NA32m. The address buffer circuits 331 to 33n are selectively coupled to the NAND gates NA321 to NA32m, and the NAND gates NA321 to NA32m produces decode signals Da0 to Dam. The word line driving unit 35 is fabricated from a plurality of NOR gates NR311 to NR31m, and the NOR gates NR311 to NR31m are enabled to drive one of the word lines WL1 to WLm in the presence of the decode enable signal DE. The NAND gates NA321 to NA32m are respectively coupled to the NOR gates NR311 to NR31m, and only one of the NOR gates NR311 to NR31m shifts the associated word line to the active high level.

The circuit behavior of the monitoring unit 36 has been described hereinbefore in detail, and the other circuits and units behave as similar to those of the prior art semiconductor memory device. Then, the description of the total circuit behavior is omitted for avoiding repetition.

Second Embodiment

Figure 5A:
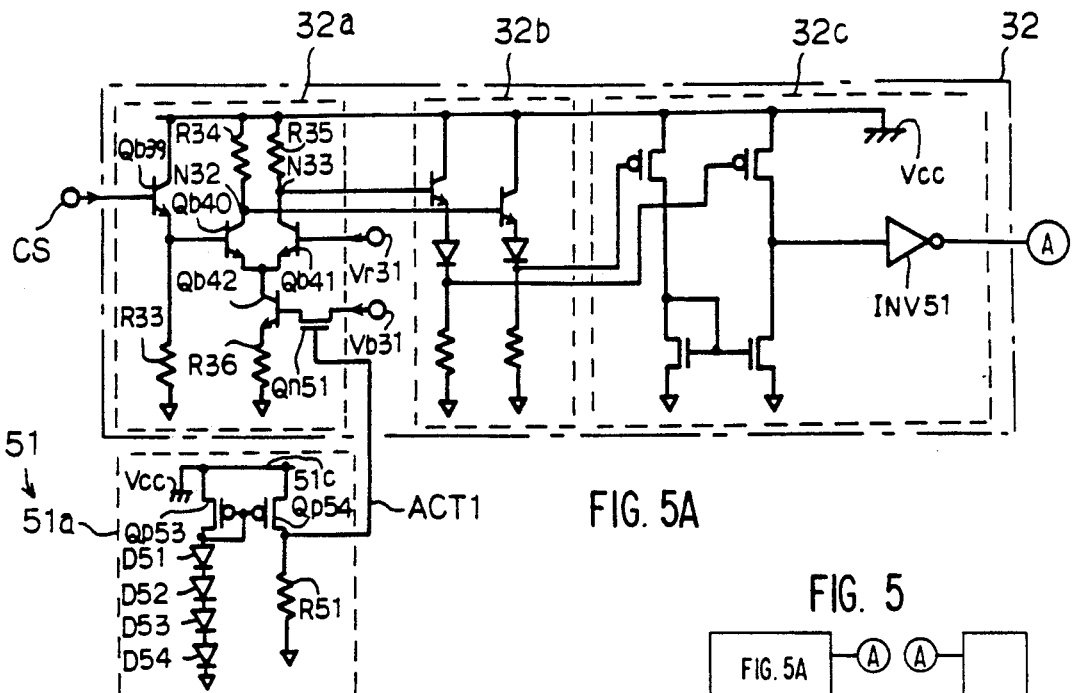
FIG. 5, 5A, 5B and 5C comprises a circuit diagram showing the arrangement of another semiconductor memory device according to the present invention.
Figure 5:
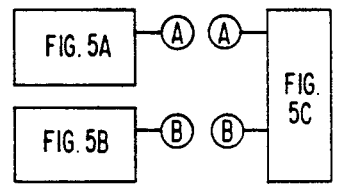
Figure 5B:
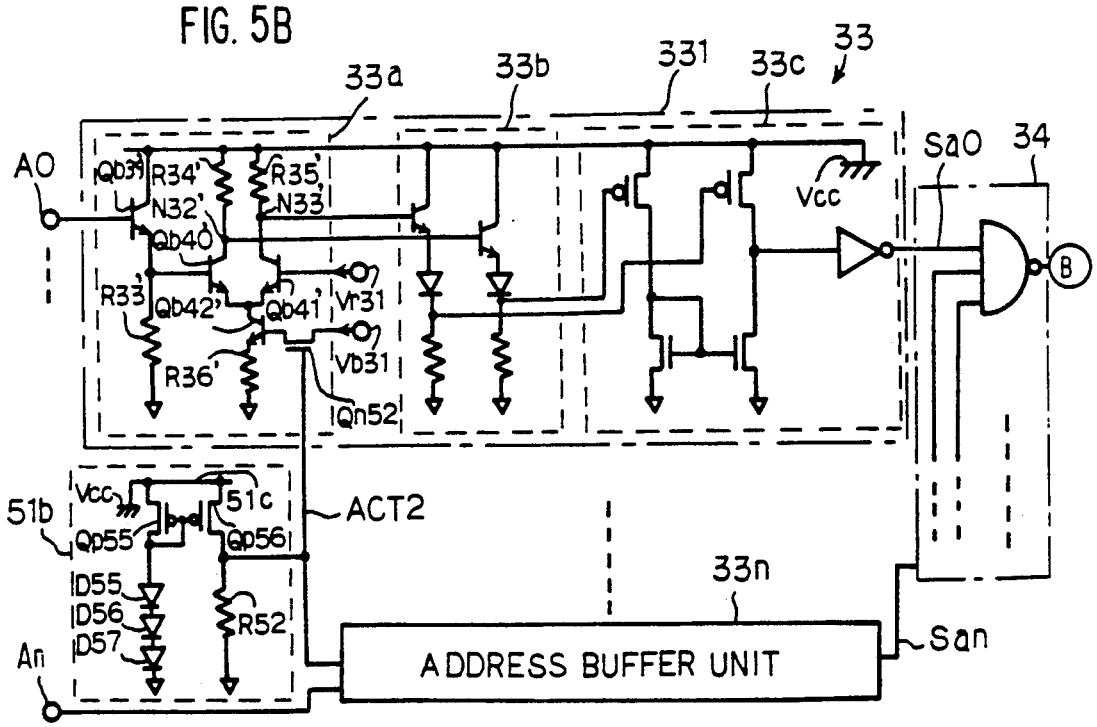
Figure 5C:
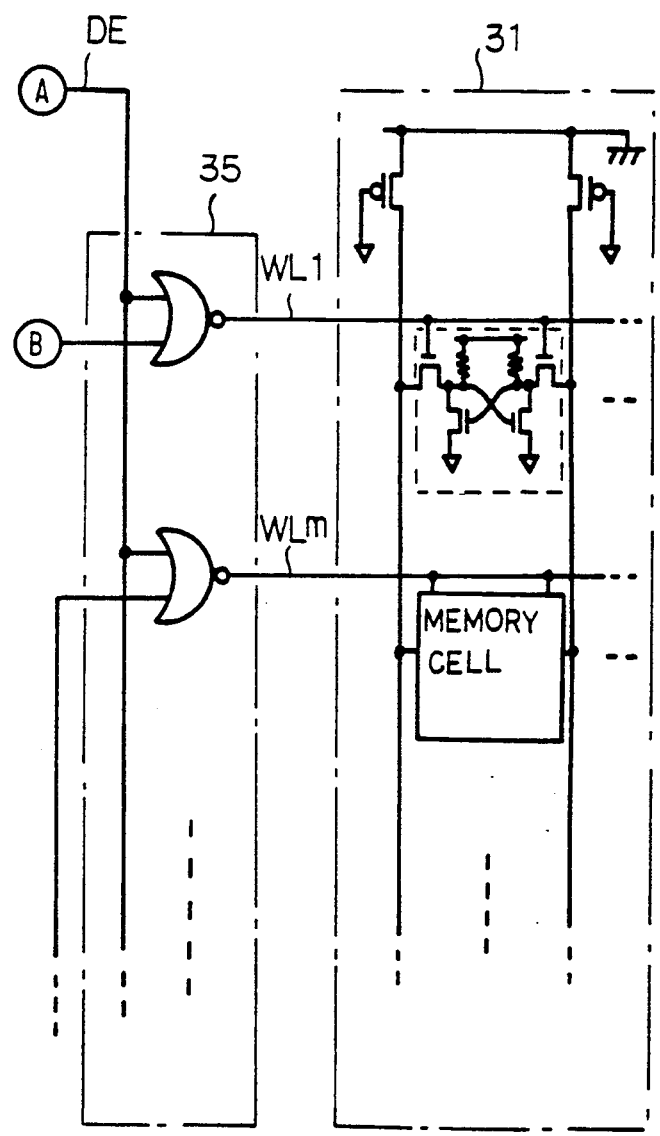

Turning to FIG. 5 of the drawings, another semiconductor memory device embodying the present invention is illustrated. The semiconductor memory device shown in FIG. 5 is similar in arrangement to the first embodiment except for a monitoring unit 51. However, the NAND gate NA31 is replaced with an inverter circuit INV51, and n-channel type field effect transistors Qn51 and Qn52 are coupled between the source of the biasing voltage level Vb31 and the base nodes of the bipolar transistors Qb42 and Qb42'. The other component units, circuits and elements are designated by the same references used in FIG. 3 without any description.

The monitoring unit 51 comprises a first monitoring circuit 51a coupled to the gate electrode of the n-channel type field effect transistor Qn51, and a second monitoring circuit 51b coupled to the n-channel type field effect transistor Qn52. The first monitoring circuit 51a comprises a third series combination of a p-channel type field effect transistor Qp53 and four diodes D51 to D54, and a fourth series combination of a p-channel type field effect transistor Qp54 and a resistor R51, and the gate electrodes of the p-channel type field effect transistors Qp53 and Qp54 are coupled to the drain node of the p-channel type field effect transistor Qp53. The third and fourth series combinations are coupled in parallel between the high voltage or Vcc line 51c and the negative power voltage source, and the resistor R51 is much larger in resistance than the p-channel type field effect transistor Qp54. A first activation signal ACT1 takes place at the drain node of the p-channel type field effect transistor Qp54 and is supplied to the gate electrode of the n-channel type field effect transistor Qn51. The second monitoring circuit 51b also comprises a fifth series combination of a p-channel type field effect transistor Qp55 and three diodes D55 to D57 coupled between the high voltage or Vcc line 51c and the negative power voltage source, and a sixth series combination of a p-channel type field effect transistor Qp56 and a resistor R52 also coupled between the high voltage line 51c and the negative power voltage source. The gate electrodes of the p-channel type field effect transistors Qp55 and Qp56 are coupled to the drain node of the p-channel type field effect transistor Qp55, and the resistance of the resistor R52 is much larger than the on-resistance of the p-channel type field effect transistor Qp56. A second activation signal ACT2 is supplied from the drain node of the p-channel type field effect transistor Qp56 to the gate electrode of the n-channel type field effect transistor Qn52 as a second activation signal ACT2. In this instance, the first total amount of the forward voltage Vfd1 of the four diodes D51 to D54 and the threshold voltage of the p-channel type field effect transistor Qp53 or Qp54 is estimated at about 3.7 volts, and the second total amount of the forward voltage of the three diodes D55 to D57 and the threshold voltage of the p-channel type field effect transistor Qp55 or Qp56 is as large as about 3.0 volts.

If the negative voltage level at the negative power voltage source is higher than −3.0 volts, the p-channel type field effect transistors Qp53 to Qp56 are turned off, and the first and second activation signals ACT1 and ACT2 remain in the low level. Then, n-channel type field effect transistors Qn51 and Qn52 remain off, and the input buffer circuits 32a and 33a are not responsive to the external chip select signal and the address bit A0, respectively.

However, if the negative voltage level is decayed below −3.0 volts but does not reach −3.7 volts, only the p-channel type field effect transistors Qp55 and Qp56 turn on to shift the second activation signal ACT2 to the high level, and the n-channel type field effect transistor Qn52 turns on. Then, the input buffer circuit 33a is activated with the biasing voltage level Vb31, but the input buffer circuit 32a is kept in the inactive state. While the input buffer circuit 32a remains inactive, the row address buffer unit 33 becomes responsive to the address bits A0 to An, and the internal address signals Sa0 to San are valid or effective to the address decoder unit 34. However, the inactive input buffer circuit 32a causes the inverter circuit INV51 to produce the decode enable signal DE of the inactive level, and, no multiple selection of the word lines takes place.

The negative voltage level is further decayed below −3.7 volts, and the p-channel type field effect transistors Qp53 and Qp54 turn on to shift the first activation signal ACT1 to the high level. The first activation signal ACT1 allows the n-channel type field effect transistor Qn51 to turn on, and the input buffer circuit 32a becomes responsive to the external chip select signal CS. Since the internal address signals Sa0 to San are valid to the row address decoder unit 34, any multiple select of word lines hardly takes place in the presence of the external chip select signal CS of the active low level. Thus, the monitoring unit 51 incorporated in the second embodiment surely prevents the word lines WL1 to WLm from the multiple select, and any large amount of transient current flows through the memory cells. The circuit behaviors of other component circuits are similar to those of the first embodiment and, accordingly, the prior art semiconductor memory device, and no further description is incorporated hereinbelow.

Although particular embodiments of the present invention have been shown and described, it will be obvious to those skilled in the art that various changes and modifications may be made without departing from the spirit and scope of the present invention. For example, the control signal buffer unit 32 may produce another enable signal such as, for example, a decode enable signal supplied to the row address decoder unit 34.

What is claimed is:

1. A semiconductor memory device comprising:
   a) a plurality of memory cells arranged in rows and columns;
   b) a plurality of word lines respectively coupled to the rows of said plurality of memory cells;
   c) a row address buffer unit coupled between first and second power voltage sources and supplied with row address bits for producing internal row address signals;
   d) a row address decoder unit responsive to said internal address signals and producing decode signals;
   e) a control signal buffer unit coupled between said first and second power voltage sources and supplied with an external control signal for producing a decode enable signal;
   f) a word line driving unit responsive to said decode signals and selectively driving said word lines in the presence of said decode enable signal; and
   g) a monitoring unit operative to monitor the power voltage level of one of said first and second power voltage sources and enabling said control signal buffer unit to produce said decode enable signal when said power voltage level allows said internal address signals to become effective to said row address decoder unit.

2. A semiconductor memory device as set forth in claim 1, in which each of said control signal buffer unit and said row address buffer unit is fabricated from bipolar transistors and field effect transistors.

3. A semiconductor memory device as set forth in claim 2, in which said monitoring unit comprises a first series combination of a first field effect transistor of a first channel conductivity type and a plurality first diodes coupled between said first and second power voltage sources, and a second series combination of a second field effect transistor of said first channel conductivity type and a first resistor coupled between said first and second power voltage sources, and in which the gate electrodes of said first and second field effect transistors are coupled to the drain node of said first field effect transistor, wherein an output enable signal is produced at the drain node of said second field effect transistor for enabling said control signal buffer unit to produce said decode enable signal.

4. A semiconductor memory device as set forth in claim 3, in which said control signal buffer unit comprises a first input buffer circuit supplied with said external control signal and fabricated from bipolar transistors and resistors, a first emitter follower circuit coupled to said first input buffer circuit and fabricated from bipolar transistors, diodes and resistors, and a first level shifting circuit coupled to said first emitter follower circuit and fabricated from field effect transistors and a logic gate, said output enable signal being supplied to said logic gate.

5. A semiconductor memory device as set forth in claim 4, in which said logic gate carries out the NAND operation.

6. A semiconductor memory device as set forth in claim 4, in which said row address buffer unit comprises a plurality of address buffer circuits each having a second input buffer circuit supplied with one of said address bits and fabricated from bipolar transistors and resistors, a second emitter follower circuit coupled to said second input buffer circuit and fabricated from bipolar transistors, diodes and resistors, and a second level shifting circuit coupled to said second emitter follower circuit and fabricated from field effect transistors and an inverter circuit, one of said internal row address signals being supplied from said second level shifting circuit.

7. A semiconductor memory device as set forth in claim 2, in which said control signal buffer unit comprises a third input buffer circuit supplied with said external control signal and having a pair of difference amplification transistors coupled in parallel through resistors to said first power voltage source and a first constant current source coupled between said difference amplification transistors and said second power voltage source, and in which said row address buffer unit comprises a plurality of address buffer circuits each supplied with one of said address bits and having a pair of difference amplification transistors coupled in parallel through resistors to said first power voltage source and a second constant current source coupled between said difference amplification transistors and said second power voltage source.

8. A semiconductor memory device as set forth in claim 7, in which said monitoring unit comprises a first monitoring circuit associated with said first constant current source, and a second monitoring circuit associated with said second constant current source, said first monitoring circuit activating said first constant current source when said power voltage level reaches a first level, said second monitoring circuit activating said second constant current source when said power voltage level reaches a second level, said first level being larger in the absolute value than said second level.

9. A semiconductor memory device as set forth in claim 8, in which said first monitoring circuit comprises a third series combination of a third field effect transistor of said first channel conductivity type and second diodes coupled between said first and second power voltage sources, and a fourth series combination of a fourth field effect transistor of said first channel conductivity type and a second resistor coupled between said first and second power voltage sources, the gate electrodes of said third and fourth field effect transistors being coupled to the drain node of said third field effect transistor, said first activation signal taking place at the drain node of said fourth field effect transistor.

10. A semiconductor memory device as set forth in claim 9, in which said second monitoring circuit comprises a fifth series combination of a fifth field effect transistor of said first channel conductivity type and third diodes coupled between said first and second power voltage sources, and a sixth series combination of a sixth field effect transistor of said first channel conductivity type and a third resistor coupled between said first and second power voltage sources, the gate electrodes of said fifth and sixth field effect transistors being coupled to the drain node of said fifth field effect transistor, said second activation signal taking place at the drain node of said sixth field effect transistor, and in which the number of said second diodes is greater than the number of said third diodes.

11. A semiconductor memory device as set forth in claim 10, in which each of said first and second constant current sources comprises a series combination of a bipolar transistor and a resistor coupled between said difference amplification transistors and said second power voltage source, and a seventh field effect transistor of a second channel conductivity type opposite to said first channel conductivity type, each of said first and second activation signals being supplied to the gate electrode of said seventh field effect transistor.

* * * * *

UNITED STATES PATENT AND TRADEMARK OFFICE
CERTIFICATE OF CORRECTION

PATENT NO. : 5,202,823
DATED : April 13, 1993
INVENTOR(S) : Kanjyu SHIMOGAWA

It is certified that error appears in the above-indentified patent and that said Letters Patent is hereby corrected as shown below:

Col. 7, line 8,, delete "kiloohms" and insert --kilo-ohms--.

Signed and Sealed this

Twenty-fifth Day of January, 1994

Attest:

BRUCE LEHMAN

*Attesting Officer*    *Commissioner of Patents and Trademarks*